United States Patent
Mukawa

(10) Patent No.: US 8,283,254 B2
(45) Date of Patent: Oct. 9, 2012

(54) ETCHING METHOD AND ETCHING APPARATUS

(75) Inventor: Takahito Mukawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/977,266

(22) Filed: Dec. 23, 2010

(65) Prior Publication Data

US 2011/0159697 A1    Jun. 30, 2011

Related U.S. Application Data

(60) Provisional application No. 61/296,303, filed on Jan. 19, 2010.

(30) Foreign Application Priority Data

Dec. 24, 2009   (JP) .................................. 2009-293094

(51) Int. Cl.
*H01L 21/302*    (2006.01)
*H01L 21/461*    (2006.01)

(52) U.S. Cl. ......... 438/706; 257/E21.214; 257/E21.222; 257/E21.256; 257/E21.26; 438/703; 438/737

(58) Field of Classification Search ........... 257/E21.214, 257/E21.222, E21.256, E21.26; 438/703, 438/706, 737
See application file for complete search history.

(56) References Cited

U.S. PATENT DOCUMENTS

| | | | |
|---|---|---|---|
| 2009/0087996 A1* | 4/2009 | Chi et al. | 438/710 |
| 2009/0212010 A1* | 8/2009 | Wang et al. | 216/47 |

FOREIGN PATENT DOCUMENTS

| | | |
|---|---|---|
| JP | 2009-152586 A | 7/2009 |
| WO | 98/32162 A | 7/1998 |

* cited by examiner

*Primary Examiner* — Asok Sarkar

(74) *Attorney, Agent, or Firm* — Pearne & Gordon LLP

(57) ABSTRACT

There are provided an etching method and an etching apparatus suitable for etching an antireflection coating layer by using a resist film as a mask. The etching method includes forming the antireflection coating layer (Si-ARC layer) on an etching target layer; forming a patterned resist film (ArF resist film) on the antireflection coating layer; and forming a desired pattern on the antireflection coating layer by introducing an etching gas including a $CF_4$ gas, a COS gas and an $O_2$ gas into a processing chamber and etching the antireflection coating layer by the etching gas while using the resist film as a mask.

8 Claims, 9 Drawing Sheets

FIG. 3

| TARGET FILM: Si-ARC (CONTAINING Si) | | | | |
|---|---|---|---|---|
| PARAMETER | | RANGE | | RECOMMENDED VALUE |
| | | Min | Max | |
| PRESSURE (mT) | | 30 | 100 | 50 |
| FLOW RATE (sccm) | COS | 0 | 50 | 30 |
| | CF4 | 50 | 300 | 250 |
| | O2 | 0 | 100 | 5 |
| POWER (W) | HF | 200 | 600 | 400 |
| TEMPERATURE (°C) | | 10 | 60 | 30 |

FIG. 4

⟨CONTROL OF COS FLOW RATE⟩

| FLOW RATE OF COS GAS | — | 0sccm | 10sccm | 30sccm | 35sccm |
|---|---|---|---|---|---|
| ETCHING TIME | INITIAL STAGE | 30sec | 60sec | 100sec | 140sec |
| CROSS SECTION | | | | | |
| ETCHING RATE (E/R) | PR E/R/Si-ARC/E/R | 110/82 nm/min | 48/56/ nm/min | 18/30/ nm/min | 2/22 nm/min |
| SELECTIVITY | — | 0.7 | 1.2 | 1.7 | 11.0 |
| TOP SURFACE | | | | | |
| LINE WIDTH (CD) | 56nm | 55nm | 55nm | 66nm | 75nm |

<CONTROL OF COS FLOW RATE>

<CONTROL OF COS FLOW RATE>

<CONTROL OF COS FLOW RATE>

<CONTROL OF COS FLOW RATE>

FIG. 6

⟨CONTROL OF COS FLOW RATE AND PRESSURE⟩

| FLOW RATE OF COS GAS | 10sccm | | | | 30sccm | | |
|---|---|---|---|---|---|---|---|
| PRESSURE | 50mT | 75mT | 30mT | | 75mT | 50mT | 75mT |
| CROSS SECTION | | | | | | | |
| ETCHING RATE (E/R) | 48/56 nm/min | 31/33 nm/min | 92/64/ nm/min | | 18/30/ nm/min | DEPOSITION | |
| TOP SURFACE | | | | | | | |
| LINE WIDTH (CD) | 52 | 53 | 57 | | 57 | — | |
| LWR | 3.0nm | 3.4nm | 4.1nm | | 2.5nm | — | |

<CONTROL OF COS FLOW RATE AND PRESSURE>

<CONTROL OF COS FLOW RATE AND PRESSURE>

⟨CONTROL OF COS FLOW RATE AND PRESSURE⟩

ETCHING METHOD AND ETCHING APPARATUS

CROSS-REFERENCE TO RELATED APPLICATION

This application claims the benefit of Japanese Patent Application No. 2009-293094 filed on Dec. 24, 2009 and U.S. Provisional Application Ser. No. 61/296,303 filed on Jan. 19, 2010, the entire disclosures of which are incorporated herein by reference.

FIELD OF THE INVENTION

The present disclosure relates to an etching method and an etching apparatus; and, more particularly, to a technique for performing etching by using a patterned resist film as a mask.

BACKGROUND OF THE INVENTION

In a mask process for forming a desired pattern in the course of manufacturing a semiconductor, patterning is performed through an exposure process and a developing process after a photosensitive film is coated on an etching target film. To suppress reflection of light during the exposure, an antireflection coating (ARC) layer is formed on the etching target film under the photosensitive film. The ARC layer may be an organic ARC layer or an inorganic ARC layer. By way of example, Patent Document 1 or 2 discloses a method for forming a pattern in an organic ARC layer by using an etching gas while suppressing reflection of light.

Since the organic ARC layer and the inorganic ARC layer have different film properties, etching gases suitable for them may be different. Thus, if an etching gas used in the etching of the organic ARC layer in Patent Document 1 or 2 is used to etch an inorganic ARC layer, effective etching may not be implemented.

Patent Document 1: Japanese Patent Laid-open Publication No. 2009-152586
Patent Document 2: Pamphlet of International Patent Publication No. WO98/32162

Especially, among inorganic ARC layers, a silicon-containing inorganic ARC layer (hereinafter, simply referred to as a "Si-ARC layer") has been etched by using a gaseous mixture of a tetrafluoromethane ($CF_4$) gas and an oxygen ($O_2$) gas as an etching gas while using an ArF resist film as a mask. In the etching process by this gaseous mixture, however, since selectivity for the Si-ARC layer against the ArF resist film is not high, a great amount of the ArF resist film is etched, resulting in a problem in a subsequent process. Further, there has occurred a pattern deformation such as line edge roughness (LER) or a pattern edge deformation such as line width roughness (LWR) due to non-uniformity in line widths of a pattern.

BRIEF SUMMARY OF THE INVENTION

In view of the foregoing, the present disclosure provides an etching method and an etching apparatus suitable for etching an antireflection coating layer by using a resist film as a mask.

In accordance with one aspect of the present disclosure, there is provided an etching method including forming an antireflection coating layer on an etching target layer; forming a patterned resist film on the antireflection coating layer; and forming a desired pattern on the antireflection coating layer by introducing an etching gas including a $CF_4$ gas, a COS gas and an $O_2$ gas into a processing chamber and etching the antireflection coating layer by the etching gas while using the resist film as a mask.

In accordance with the etching method, the antireflection coating layer is etched by using the etching gas including the $CF_4$ gas, the COS gas and the $O_2$ gas while using the resist film as a mask. Among the $CF_4$ gas, the COS gas and the $O_2$ gas, the $CF_4$ gas is mainly used for the etching of the antireflection coating layer; the COS gas is mainly used for the coating (deposition) on an etched surface of the antireflection coating layer; and the $O_2$ gas is mainly used to reduce the coating (deposition) of the COS gas. In this way, while the antireflection coating layer is being etched by the $CF_4$ gas, coating of the COS gas and suppression of the coating by the $O_2$ gas is balanced. Thus, selectivity between the resist film and the antireflection coating layer can be improved and LWR of the antireflection coating layer can also be ameliorated.

The resist film may be an ArF resist film.
The antireflection coating layer may contain silicon.
A maximum flow rate of the COS gas included in the etching gas may be about 50 sccm.
A flow rate of the $CF_4$ gas included in the etching gas may be in a range of about 50 sccm to about 300 sccm.
A maximum flow rate of the $O_2$ gas included in the etching gas may be about 100 sccm.
A flow rate of the COS gas and a flow rate of the $O_2$ gas included in the etching gas may be controlled proportionately to each other.
A pressure within the processing chamber may be in a range of about 30 mT to about 100 mT.
A maximum pressure within the processing chamber may be about 75 mT.

In accordance with another aspect of the present disclosure, there is provided an etching apparatus including a gas supply source that supplies an etching gas including a $CF_4$ gas, a COS gas and an $O_2$ gas into a processing chamber; and a high frequency power supply that supplies a high frequency power into the processing chamber. Plasma is generated from the etching gas by using the high frequency power, and an etching process is performed by the plasma on a processing target object having an antireflection coating layer and a patterned resist film, so that a desired pattern is formed on the antireflection coating layer.

In accordance with the present disclosure as described above, the selectivity between the resist film and the antireflection coating layer and the LWR of the antireflection coating layer can be improved by the etching method suitable for the etching of the antireflection coating layer using the resist film as a mask.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 3 is a diagram showing processing conditions for the etching process in accordance with the embodiment of the present disclosure;

FIG. 4 is a diagram showing a remaining state of a mask when a COS flow rate is controlled in the etching process in accordance with the embodiment of the present disclosure;

FIG. 6 is a diagram showing a remaining state of a mask when a COS flow rate and a pressure are controlled in the etching process in accordance with the embodiment of the present disclosure.

DETAILED DESCRIPTION OF THE INVENTION

Figure 1:
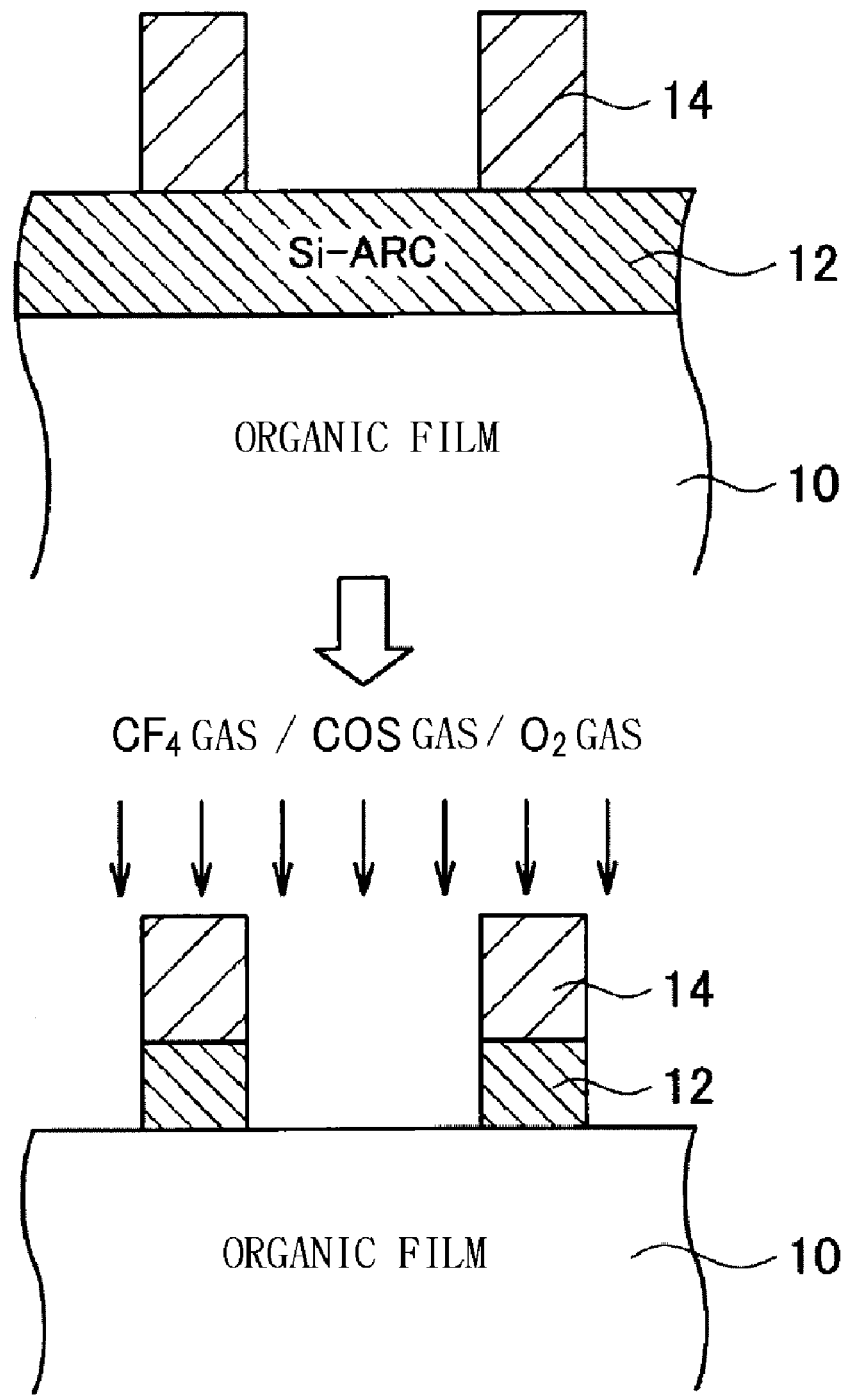
FIG. 1 is a diagram illustrating an etching process of a Si-ARC layer in accordance with an embodiment of the present disclosure.

Hereinafter, embodiments of the present disclosure will be described in detail with reference to the accompanying drawings. Through the present specification and drawings, parts having the substantially same function and configuration will be assigned same reference numerals, and redundant description thereof will be omitted.

An etching method in accordance with an embodiment of the present disclosure is suitable for etching a silicon-containing inorganic antireflection coating layer (Si-ARC layer) by using an ArF resist film as a mask. FIG. 1 is a cross sectional view illustrating a layered films for describing the etching method for the Si-ARC layer in accordance with the present embodiment.

As shown in an upper diagram of FIG. 1, a Si-ARC layer is formed on an organic film 10 which is an etching target layer. The Si-ARC layer 12 is used to suppress reflection of light during an exposure process for a photosensitive film. The organic film 10 is an example etching target layer, and the etching target layer is not limited thereto. By way of example, the etching target layer may be an insulating film, a conductive film, or a silicon substrate.

An ArF resist film 14 is formed on the Si-ARC layer 12. The ArF resist film 14 is formed on the Si-ARC layer 12 by ArF lithography. To elaborate, a photoresist is coated on the Si-ARC layer 12, and the photoresist is exposed to an ArF laser beam having a wavelength of about 193 nm through a light blocking member called a mask having a desired pattern to be formed. After the exposure process, photosensitized portions of the photoresist are chemically etched, so that the ArF resist film 14 having the desired pattern is formed. In this way, by employing ArF lithography using an ArF laser beam of a short wavelength as an exposure light source, miniaturization of a circuit can be achieved.

Here, the ArF resist film 14 is merely an example resist film for forming a pattern on the Si-ARC layer, and the resist film may not be limited thereto. By way of example, the resist film may be formed by using g-rays (about 435 nm), i-rays (about 365 nm), KrF laser (about 248 nm), or the like.

A lower diagram of FIG. 1 illustrates an etching process. In this etching process, the Si-ARC layer 12 is etched by using a gaseous mixture including a tetrafluoromethane ($CF_4$) gas, a carbonyl sulfide (COS) gas and an oxygen ($O_2$) gas as an etching gas. The ArF resist film 14 serves as a mask. As a result of the etching, the desired pattern is formed on the Si-ARC layer 12.

(LWR/Selectivity)

The inventor has proved in experiments that LWR (Line Width Roughness) of the Si-ARC layer 12 and selectivity between the ArF resist film 14 and the Si-ARC layer 12 can be improved by using the gaseous mixture including the $CF_4$ gas, the COS gas and the $O_2$ gas.

Figure 2:
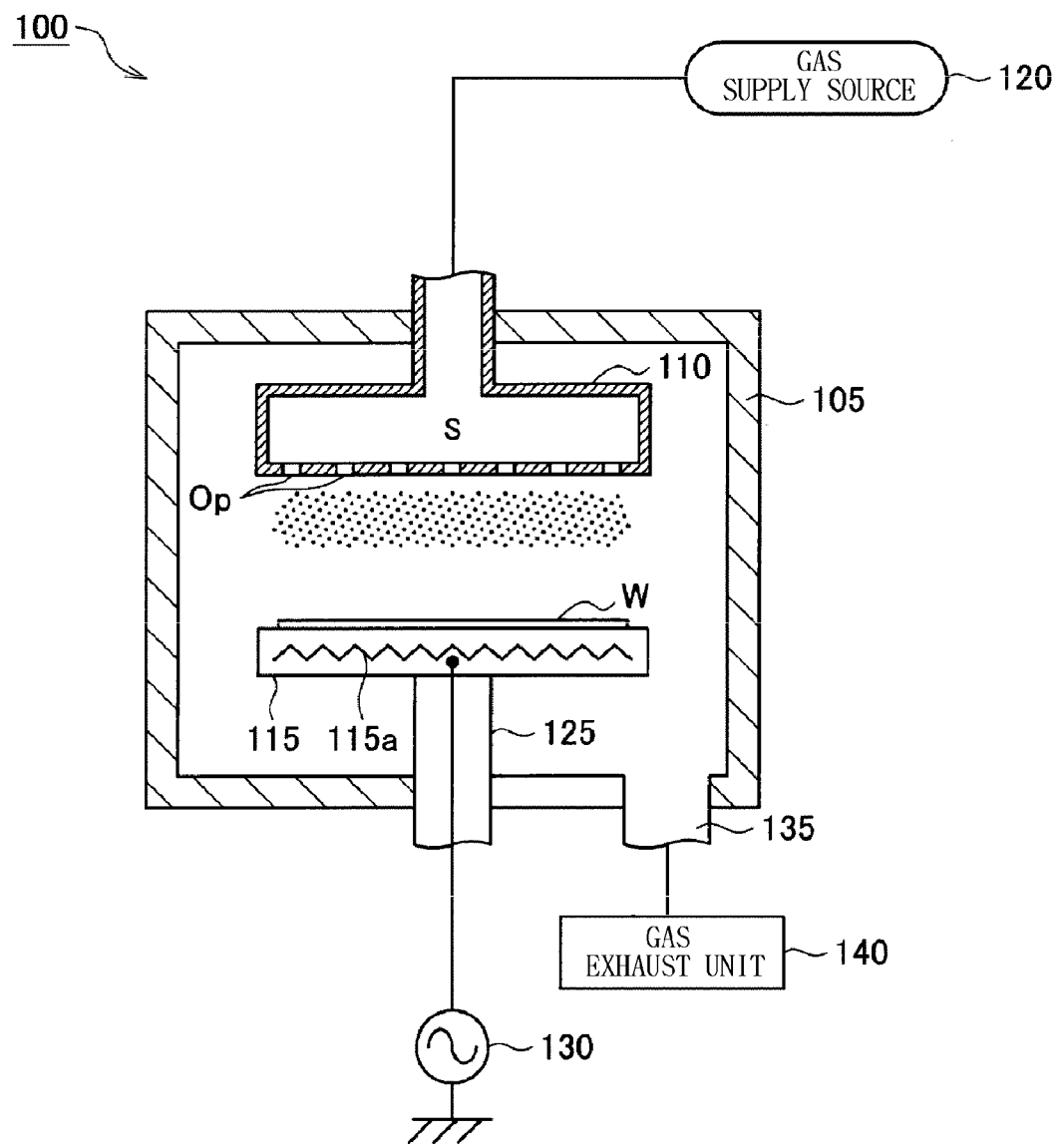
FIG. 2 is a cross sectional view of a plasma processing apparatus that performs the etching process in accordance with the embodiment of the present disclosure.

For the experiments, a plasma processing apparatus of a parallel plate type as illustrated in FIG. 2 was used as an etching apparatus. A configuration of this etching apparatus will be briefly described.

An etching apparatus 100 includes a processing chamber 105. The processing chamber 105 is made of a metal such as aluminum and is grounded. An upper electrode 110 and a lower electrode 115 are installed within the processing chamber 105 so as to face each other, and the upper electrode 110 and the lower electrode 115 serve as a pair of parallel plate electrodes. A multiple number of gas holes Op are formed through the upper electrode 110, and the upper electrode 110 also serves as a shower plate. The $CF_4$ gas, the COS gas and the $O_2$ gas supplied from a gas supply source 120 are introduced into the processing chamber 105 through the gas holes Op after diffused in a gas diffusion space S within the processing chamber 105.

The lower electrode 115 is supported on a support 125, and a wafer W is mounted on a mounting surface of the lower electrode 115 as a mounting table. A heater 115a and a non-illustrated cooling pipe are embedded in the lower electrode (mounting table) 115 to control a temperature of the wafer W to a preset value. The lower electrode 115 is connected with a high frequency power supply 130 via a non-illustrated matching unit. The gaseous mixture including the $CF_4$ gas, the COS gas and the $O_2$ gas introduced into the processing chamber 105 is excited by an electric field energy of a high frequency outputted from the high frequency power supply 130. As a result, plasma by electric discharge is generated in a plasma space between the upper electrode 110 and the lower electrode 115, and the etching process in FIG. 1 is performed on the wafer W by the plasma.

A gas exhaust port 135 is formed in a bottom of the processing chamber 105, and the inside of the processing chamber 105 can be maintained in a desired vacuum state by driving a gas exhaust unit 140 connected to the gas exhaust port 135.

The Si-ARC layer 12 was etched by the etching apparatus 100 configured as described above. Ranges of available processing conditions are provided in FIG. 3. Specifically, a pressure within the processing chamber 105 may range from about 30 mT to about 100 mT. By way of example, a pressure of about 50 mT may be chosen.

As for flow rates of the gases supplied from the gas supply source 120, a flow rate of the COS gas may be equal to or less than about 50 sccm, and, for example, about 30 sccm can be selected. A flow rate of the $CF_4$ gas may range from about 50 sccm to about 300 sccm, and, for example, about 250 sccm can be selected. Further, a flow rate of the $O_2$ gas may be equal to or less than about 100 sccm, and, for example, about 5 sccm can be selected.

A power outputted from the high frequency power supply 130 may be in the range of about 200 W to about 600 W, and, for example, a power of about 400 W can be selected. Further, a temperature of the heater 115a within the mounting table may be in the range of about 10° C. to about 60° C., and about 30° C. can be selected.

Below, experiment results of performing an etching process while varying a flow rate of the COS gas, and a resultant etched state after the etching process will be discussed first. Then, experiment results of performing an etching process while varying both a flow rate of the COS gas and a pressure, and a resultant etched state after the etching process will be discussed.

(Flow Rate Control of the COS Gas)

First, a relationship between a flow rate control for the COS gas and an etched state will be explained with reference to FIGS. 4 to 5D. Processing conditions for the experiment will be specified. An etching target layer is a Si-ARC layer, and an ArF resist film is used as a mask. An internal pressure of the processing chamber is about 50 mT; a high frequency power is about 400 W; flow rates of the $CF_4$ gas and the $O_2$ gas are about 250 sccm and about 5 sccm; and a flow rate of the COS gas is varied in the range of about 0 sccm to about 35 sccm. An etching time is about 30% of an overetching time, and actual etching times are as specified in FIG. 4. Further, since deposition of the COS gas progresses excessively when the flow rate of the COS gas reaches about 40 sccm or higher, measurement was not performed in such a range.

A DC voltage (DCS) is not applied to the upper electrode 110. A pressure within the non-illustrated cooling pipe in the lower electrode 115 is about 30 T both at a center side and an edge side. As for a temperature of the processing chamber 105, temperatures of the upper electrode 110 and a sidewall of the processing chamber 105 are both about 60° C. and a temperature of the lower part of the wafer W is about 30° C.

Figure 5A:
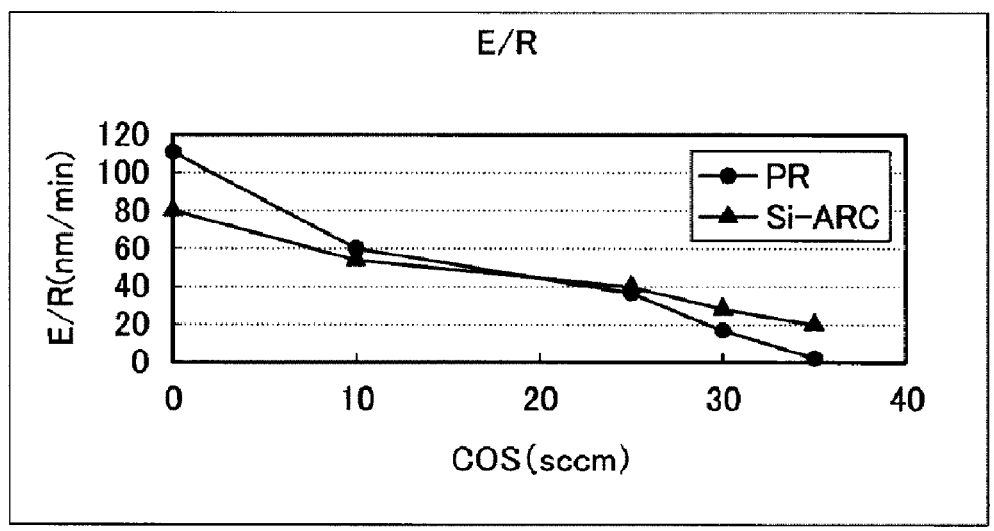
FIGS. 5A to 5D are graphs showing a relationship between a COS flow rate, an etching rate and selectivity in the etching process in accordance with the embodiment of the present disclosure.
Figure 5B:
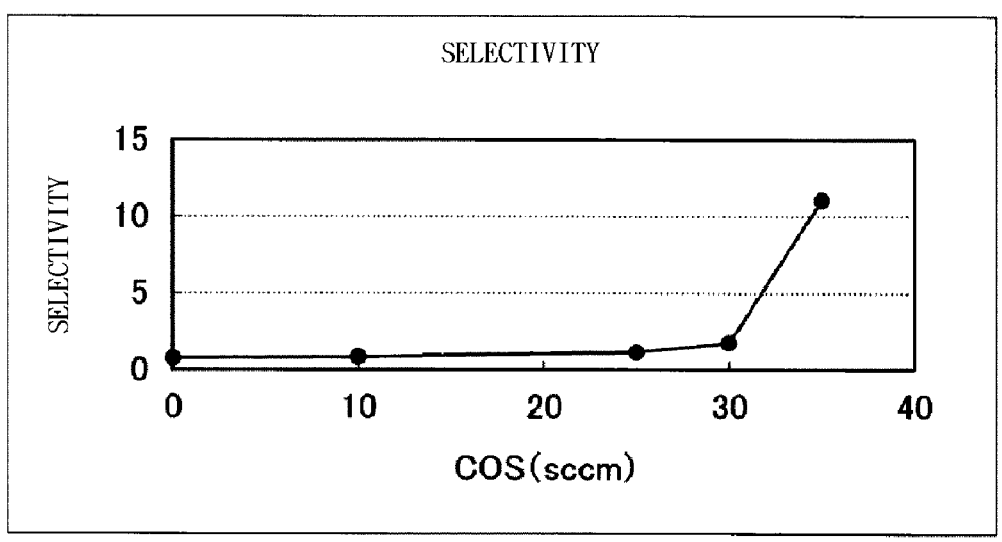
Figure 5C:
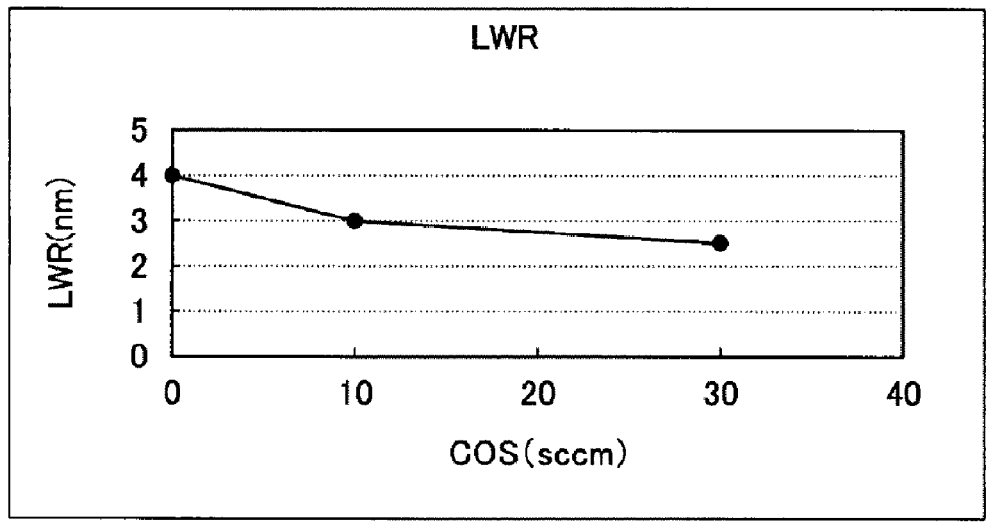
Figure 5D:
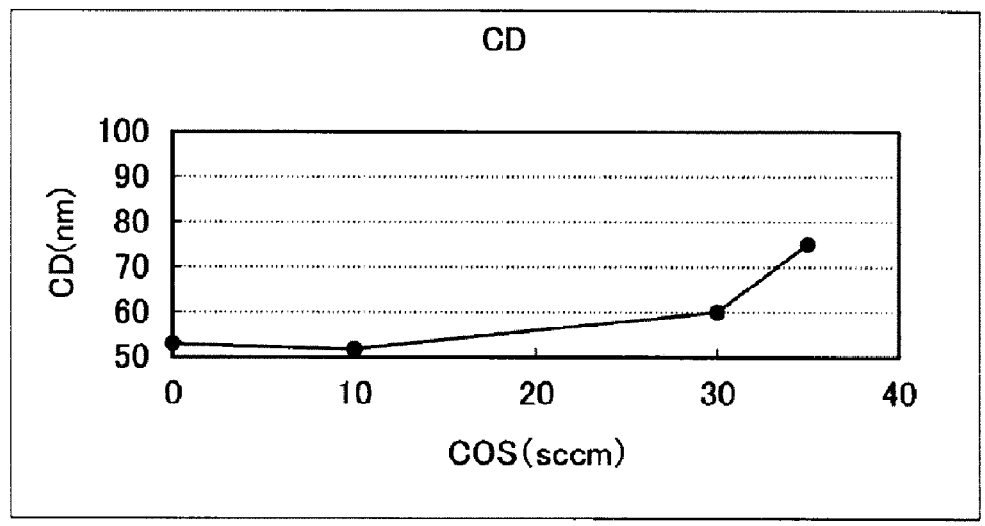

Experiment results obtained under the above processing conditions are provided in FIGS. 4 to 5D. A leftmost upper image of FIG. 4 shows a cross sectional state same as that of the upper diagram of FIG. 1, and a patterned ArF resist film 14, a Si-ARC layer 12 in a non-etched initial state and a base film are shown in sequence from the top. A leftmost lower image of FIG. 4 is a diagram viewed from the top of the leftmost upper image of FIG. 4, and it shows a line width (CD: Critical Dimension) of a resist pattern in an initial state.

In this experiment, as depicted in FIG. 4 and FIG. 5A, a flow rate of the COS gas is varied from about 0 sccm, to about 10 sccm, to about 30 sccm, and to about 35 sccm. As a result of the experiment, an etching rate (E/R) (an etching rate (PR E/R) of the ArF resist film and an etching rate (Si-ARC E/R) of the Si-ARC layer) is found to decrease as the flow rate of the COS gas increases.

Further, as shown in FIG. 4 and FIG. 5B, selectivity is found to improve as the flow rate of the COS gas increases. Especially, it is found out that the selectivity increases remarkably when the flow rate of the COS gas increases from about 30 sccm to about 35 sccm.

Furthermore, as depicted in FIG. 4 and FIG. 5C, LWR (Line Width Roughness) is found to decrease as the flow rate of the COS gas increases. Thus, generation of non-uniformity in line widths is suppressed, and, thus, deformation of a pattern shape may be reduced. This effect is deemed to be obtained due to the coating of the COS gas.

Further, as shown in FIG. 4 and FIG. 5D, a line width (CD) of the pattern is found to increase as the flow rate of the COS gas increases. This effect is deemed to be obtained due to the deposition of the COS gas.

From the above results, among the $CF_4$ gas, the COS gas and the $O_2$ gas, the $CF_4$ gas is deemed to be mainly used to etch the Si-ARC layer 12.

Further, since the etching rate E/R (the etching rate (PR E/R) of the resist film and the etching rate (Si-ARC E/R) of the Si-ARC layer) deteriorates as the flow rate of the COS gas increases, the COS gas is deemed to be mainly used for the coating (deposition) on an etched surface. Thus, with a rise of the flow rate of the COS gas, an etched amount of the ArF resist film would be reduced, and selectivity between the ArF resist film and the Si-ARC layer may be improved.

Further, the $O_2$ gas is deemed to be mainly used to reduce the coating (deposition) of the COS gas.

From the above experiment results, it was proved that the selectivity between the ArF resist film 14 and the Si-ARC layer 12 and the LWR of the Si-ARC layer 12 can be improved by performing the etching process on the Si-ARC layer 12 by using the etching gas including the $CF_4$ gas, the COS gas and the $O_2$ gas while using the ArF resist film 14 as a mask.

(Flow Rate Control of the COS Gas and Pressure Control)

Now, a relationship between a flow rate control of the COS gas, a pressure control and an etched state will be discussed with reference to FIGS. 6 to 7C. As for processing conditions, in a treatment process, a pressure within the processing chamber is about 100 mT; a high frequency power is about 200 W; a $H_2$ gas and a $N_2$ gas are introduced into the processing chamber at flow rates of about 450 sccm; a treatment time is about 120 sec; and a DC voltage (DCS) is not applied to the upper electrode 110.

In an etching process after the treatment process, an etching target film is a Si-ARC layer, and an ArF resist film is used as a mask. In this experiment, a flow rate of the COS gas is varied from 0, to about 10 sccm and to about sccm, and a pressure within the processing chamber is varied from about 30 mT to about 50 mT and to about 75 mT. A high frequency power is about 400 W; flow rates of the $CF_4$ gas and the $O_2$ gas are about 250 sccm and about 5 sccm, while the flow rate of the COS gas is varied in the range of about 0 sccm to about 35 sccm. An etching time is about 30% of an overetching time. A pressure within the non-illustrated cooling pipe in the lower electrode 115 is about 30 T both at a center side and an edge side. As for a temperature of the processing chamber 105, temperatures of the upper electrode 110 and a sidewall of the processing chamber are both about 60° C. and a temperature of the lower part of the wafer W is about 30° C.

Figure 7A:
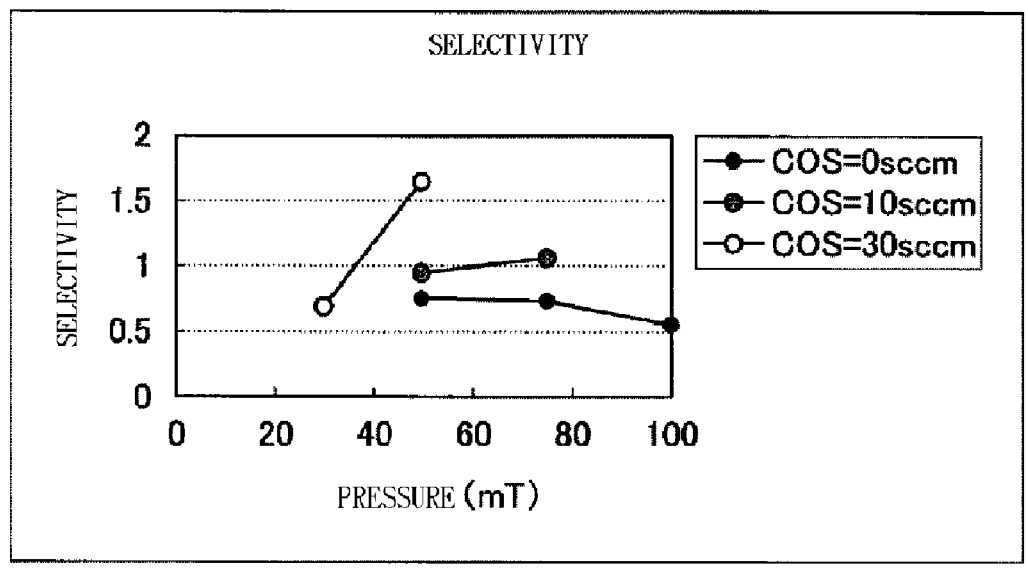
FIGS. 7A to 7C are graphs showing a relationship between a COS flow rate, a pressure, selectivity and LWR in the etching process in accordance with the embodiment of the present disclosure.
Figure 7B:
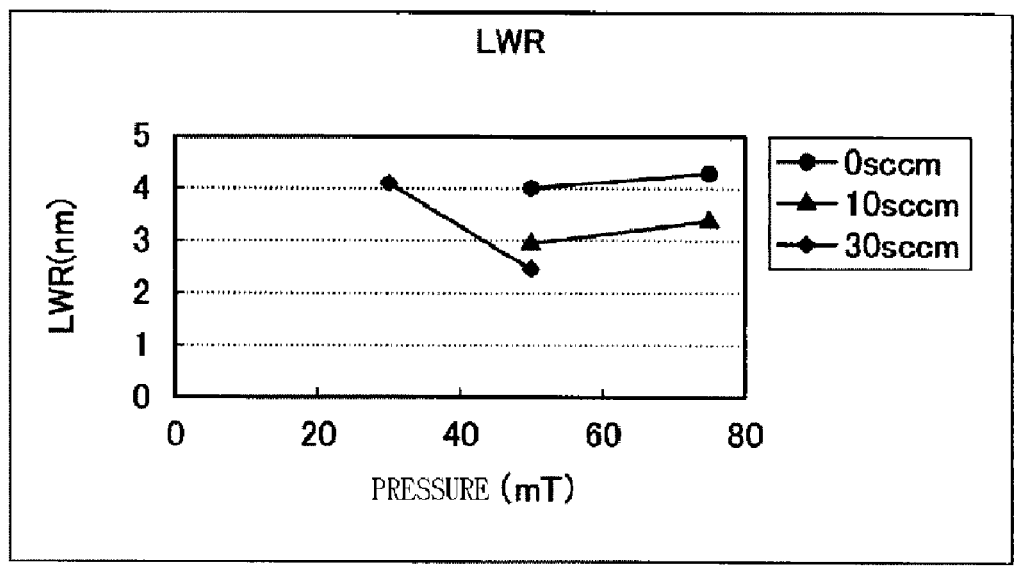
Figure 7C:
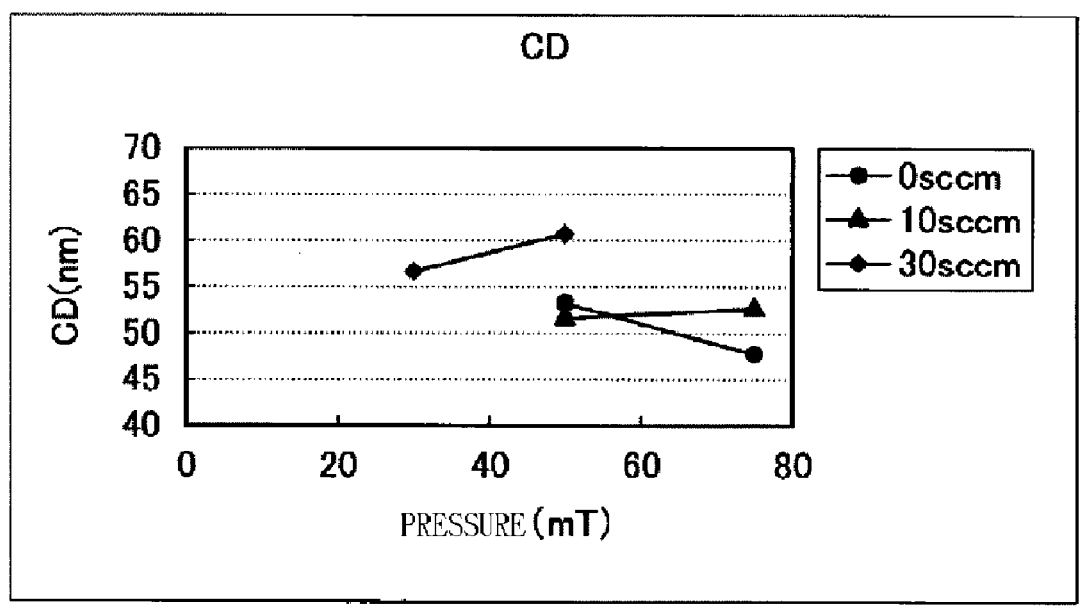

Experiment results obtained under the above processing conditions are provided in FIGS. 6 to 7C. Left-half images of FIG. 6 show etched states when the flow rate of the COS gas is about 10 sccm, and right-half images of FIG. 6 show etched states when the flow rate of the COS gas is about 30 sccm.

From this experiment, an etching rate E/R is found to increase with a decrease of a pressure in both cases that the flow rates of the COS gas are set to be about 10 sccm and about 30 sccm. If the pressure increases, the amount of deposits may be increased. Thus, in the result shown in FIG. 6, if the pressure within the processing chamber reaches about 75 mT, deposits of COS may increase excessively, and the etching process may end in a failure.

Further, as depicted in FIG. 6 and FIG. 7A, when the flow rate of the COS gas is higher than about 0 sccm (i.e., when the flow rate of the COS gas is about 10 sccm or about 30 sccm), selectivity is found to improve with a rise of the pressure within the processing chamber.

Furthermore, as shown in FIG. 6 and FIG. 7B, when the flow rate of the COS gas is about 30 sccm and the pressure is about 50 mT, LWR is found to be optimized.

Moreover, as depicted in FIG. 6 and FIG. 7C, a line width (CD) of a pattern is found to increase with a rise of the flow rate of the COS gas. This effect is deemed to be obtained due to the deposition of the COS gas.

From the above results, among the $CF_4$ gas, the COS gas and the $O_2$ gas, the $CF_4$ gas is deemed to be mainly used to etch the Si-ARC layer 12; the COS gas is deemed to be mainly used to coat an etched surface of the pattern; and the $O_2$ gas is deemed to be mainly used to suppress the deposition of the COS gas. Here, it can be found out that an etching rate E/R increases with a decrease of the pressure within the processing chamber, whereas the deposition of the COS gas increases with a rise of the pressure within the processing chamber.

Furthermore, it can be also found out that etching rates (an etching rate (PR E/R) of the ArF resist film and an etching rate (Si-ARC E/R) of the Si-ARC layer) improve as the flow rate of the COS gas increases and the pressure decreases.

As can be seen from the above-described experiment results, it may be desirable to use the etching gas including the $CF_4$ gas, the COS gas and the $O_2$ gas to improve the selectivity and LWR. If, however, the flow rate of the COS gas increases beyond a certain level, etching stop may occur due to deposition of the highly adhesive COS gas. Accordingly, to carry out an effective etching process while suppressing the deposition, a maximum value of the pressure within the processing chamber may be set to be about 75 mT based on the result in FIG. 6.

Further, as stated above, since the COS gas is mainly used to coat the etched surface of the pattern while the $O_2$ gas is mainly used to suppress the deposition of the COS gas, it may be desirable to maintain a constant flow rate ratio between the COS gas and the $O_2$ gas.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

By way of example, in accordance with the present disclosure, the resist film may not be limited to the ArF resist film but may be of another film. Further, in accordance with the present disclosure, the antireflection coating layer may not be limited to the Si-ARC layer, but it may be an inorganic antireflection coating layer without containing silicon, or it may be an organic antireflection coating layer. In general, the inorganic antireflection coating layer may be mainly etched by a fluorine-based gas, while the organic antireflection coating layer may be mainly etched by an oxygen-based gas.

In accordance with the present disclosure, the etching gas may be a gaseous mixture including a $CF_4$ gas, a COS gas and an $O_2$ gas, but the gaseous mixture may include an inert gas in addition to the $CF_4$ gas, the COS gas and the $O_2$ gas.

The etching apparatus in accordance with the present disclosure may be any type of plasma processing apparatus without being limited to the plasma processing apparatus of a parallel plate type. By way of example, the etching apparatus may be an ICP (Inductively Coupled Plasma) processing apparatus.

What is claimed is:

1. An etching method comprising:

forming an antireflection coating layer on an etching target layer;

forming a patterned resist film on the antireflection coating layer; and forming a desired pattern on the antireflection coating layer by introducing an etching gas including a $CF_4$ gas, a COS gas and an $O_2$ gas into a processing chamber and etching the antireflection coating layer by the etching gas while using the resist film as a mask, wherein the COS gas, at a certain flow rate, can become deposited on an etched surface of the antireflection coating layer and the $O_2$ gas is used to suppress the deposition of the COS gas, and a flow rate of the COS gas and a flow rate of the $O_2$ gas included in the etching gas are controlled proportionately to each other to balance the deposition of the COS gas and suppression of the deposition by the $O_2$ gas.

2. The etching method of claim 1, wherein the resist film is an ArF resist film.

3. The etching method of claim 1, wherein the antireflection coating layer contains silicon.

4. The etching method of claim 1, wherein a maximum flow rate of the COS gas included in the etching gas is about 50 sccm.

5. The etching method of claim 1, wherein a flow rate of the $CF_4$ gas included in the etching gas is in a range of about 50 sccm to about 300 sccm.

6. The etching method of claim 1, wherein a maximum flow rate of the $O_2$ gas included in the etching gas is about 100 sccm.

7. The etching method of claim 1, wherein a pressure within the processing chamber is in a range of about 30 mT to about 100 mT.

8. The etching method of claim 7, wherein a maximum pressure within the processing chamber is about 75 mT.

\* \* \* \* \*